(12) United States Patent
Oka et al.

(10) Patent No.: US 8,299,603 B2
(45) Date of Patent: Oct. 30, 2012

(54) POWER SEMICONDUCTOR DEVICE

(75) Inventors: Seiji Oka, Tokyo (JP); Osamu Usui, Tokyo (JP); Yasushi Nakayama, Tokyo (JP); Yoshiko Obiraki, Tokyo (JP); Takeshi Oi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 249 days.

(21) Appl. No.: 12/523,948

(22) PCT Filed: Jan. 18, 2008

(86) PCT No.: PCT/JP2008/000046
§ 371 (c)(1),
(2), (4) Date: Jul. 21, 2009

(87) PCT Pub. No.: WO2008/090734
PCT Pub. Date: Jul. 31, 2008

(65) Prior Publication Data
US 2010/0117219 A1  May 13, 2010

(30) Foreign Application Priority Data
Jan. 22, 2007  (JP) ................... 2007-011198

(51) Int. Cl.
*H01L 23/48* (2006.01)
(52) U.S. Cl. ........ 257/697; 257/693; 257/698; 257/150; 257/177; 438/121; 438/122; 438/124; 438/126; 438/127
(58) Field of Classification Search .......... 257/697, 257/698, 693, 150, 177; 438/121, 122, 124, 438/126, 127
See application file for complete search history.

(56) References Cited

U.S. PATENT DOCUMENTS

| | | | | |
|---|---|---|---|---|
| 5,767,579 | A * | 6/1998 | Kanazawa et al. | 257/717 |
| 6,100,585 | A * | 8/2000 | Chiba | 257/734 |
| 6,501,172 | B1 | 12/2002 | Fukada et al. | |
| 6,700,194 | B2 | 3/2004 | Nakajima et al. | |
| 7,081,671 | B2 | 7/2006 | Fukada et al. | |
| 7,816,781 | B2 * | 10/2010 | Thoben et al. | 257/693 |
| 2001/0025964 | A1 | 10/2001 | Loddenkotter et al. | |
| 2002/0190374 | A1 | 12/2002 | Nakajima et al. | |

(Continued)

FOREIGN PATENT DOCUMENTS

DE  44 07 810 A1  9/1995
(Continued)

OTHER PUBLICATIONS

U.S. Appl. No. 12/504,225, filed Jul. 16, 2009, Oi, et al.

(Continued)

*Primary Examiner* — N Drew Richards
*Assistant Examiner* — Yu-Hsi D Sun
(74) *Attorney, Agent, or Firm* — Oblon, Spivak, McClelland, Maier & Neustadt, L.L.P.

(57) ABSTRACT

A power semiconductor device in which transfer molding resin seals: a metallic circuit substrate; a power semiconductor element joined to a wiring pattern; and a side surface of a cylindrical external terminal communication section provided on the wiring pattern and to which an external terminal can be inserted and connected. The cylindrical external terminal communication section is substantially perpendicular to a surface on which the wiring pattern is formed. An outer surface of a metal plate of the metallic circuit substrate and a top portion of the cylindrical external terminal communication section are exposed from the transfer molding resin. The transfer molding resin is not present within the cylindrical external terminal communication section.

12 Claims, 8 Drawing Sheets

U.S. PATENT DOCUMENTS

| | | |
|---|---|---|
| 2004/0125529 A1 | 7/2004 | Arai et al. |
| 2005/0280490 A1 | 12/2005 | Uchiyama et al. |
| 2007/0215999 A1 * | 9/2007 | Kashimoto et al. ........... 257/678 |

FOREIGN PATENT DOCUMENTS

| | | |
|---|---|---|
| DE | 100 08 572 A1 | 9/2001 |
| DE | 100 47 126 A1 | 5/2002 |
| DE | 10 2005 017 849 A1 | 10/2006 |
| DE | 10 2006 051 454 A1 | 9/2007 |
| JP | 8 316357 | 11/1996 |
| JP | 9 22970 | 1/1997 |
| JP | 9-321216 | 12/1997 |
| JP | 11 204724 | 7/1999 |
| JP | 2001 298129 | 10/2001 |
| JP | 2001 332679 | 11/2001 |
| JP | 2002 231883 | 8/2002 |
| JP | 2003 7966 | 1/2003 |
| JP | 2004 207432 | 7/2004 |
| JP | 2006 165499 | 6/2006 |
| JP | 2007 150303 | 6/2007 |
| JP | 2007 184315 | 7/2007 |

OTHER PUBLICATIONS

U.S. Appl. No. 12/504,250, filed Jul. 16, 2009, Obiraki, et al.
U.S. Appl. No. 12/535,222, filed Aug. 4, 2009, Oka, et al.
U.S. Appl. No. 12/540,880, filed Aug. 13, 2009, Obiraki, et al.
U.S. Appl. No. 12/577,376, filed Oct. 12, 2009, Obiraki, et al.
U.S. Appl. No. 12/582,025, filed Oct. 20, 2009, Oka, et al.
Office Action issued Aug. 1, 2011, in German Patent Application No. 11 2008 000 229.0 (with English-language translation).
U.S. Appl. No. 13/150,593, filed Jun. 1, 2011, Oka, et al.
Japanese Office Action dated Jun. 12, 2012, in Japanese Patent Application No. 2008-555000.

* cited by examiner

POWER SEMICONDUCTOR DEVICE

TECHNICAL FIELD

The present invention relates to a resin-sealed power semiconductor device formed by transfer molding, which is excellent in productivity. The present invention particularly relates to a resin-sealed power semiconductor device formed by transfer molding, which is small in size and which realizes large-current operation.

BACKGROUND ART

A power semiconductor device, such as a power module, operates with a large current and a high voltage. For this reason, it is essential to efficiently discharge heat, which is generated by the operation of the power semiconductor device, to the outside of the power semiconductor device. Accordingly, in a power semiconductor device, a wiring pattern is formed on a metal plate that acts as a heat sink, while an insulation layer is interposed between the wiring pattern and the metal plate. A power semiconductor element is provided on the wiring pattern. The power semiconductor element is sealed with resin.

One of such power semiconductor devices is formed with: a metal plate acting as a heat sink; a wiring pattern formed on the metal plate, having a ceramic plate interposed between the wiring pattern and the metal plate as an insulation layer; external lead terminals joined to the wiring pattern, which rise from a surface on which power semiconductor elements are mounted; metal wires connecting the external lead terminals to the power semiconductor elements; an external casing formed of thermoplastic resin, which is bonded to the metal plate; silicon gel filled in a concave portion formed with the external casing and a substrate on which the power semiconductor elements are mounted; and heat-hardening resin filled above the silicon gel (see, e.g., Patent Document 1)

However, in manufacturing of this conventional power semiconductor device, there are: a process of bonding the external casing, which is formed of thermoplastic resin, to the metal plate; a process of filling and curing the silicon gel; and a process of injecting and curing the heat-hardening resin. Thus, there are a large number of manufacturing processes, causing a prolonged manufacturing time. Accordingly, there is a problem of low productivity.

A power semiconductor device which solves this problem and which is excellent in productivity is a power semiconductor device in which: a lead frame is provided on a metal plate while an insulation layer is interposed between the lead frame and the metal plate; and power semiconductor elements are mounted on the lead frame and sealed with transfer molding resin (see, e.g., Patent Document 2).

[Patent Document 1] Japanese Laid-Open Patent Publication No. H08-316357 (Page 3, FIG. 1)

[Patent Document 2] Japanese Laid-Open Patent Publication No. 2001-196495 (Page 3, FIG. 1)

DISCLOSURE OF THE INVENTION

Problems to be Solved by the Invention

In the power semiconductor device sealed with transfer molding resin, the outer periphery of the lead frame has portions, each of which is, at one end thereof, connected to a power semiconductor element by a metal wire and each of which acts as an external terminal.

That is, the lead frame, which is provided on the metal plate while the insulation layer is interposed between the lead frame and the metal plate and which has the power semiconductor elements mounted thereon, is sealed with the transfer molding resin together with the power semiconductor elements. However, the other end of each of said portions of the outer periphery of the lead frame protrudes from the resin-sealed portion. The tie bar of the lead frame protruding from the resin-sealed portion is cut away, and each of said portions is used as a separate external terminal.

However, since the sealing with transfer molding resin is performed when the lead frame is sandwiched between upper and lower molds, a protruding direction of each external terminal is in parallel to a surface on which the power semiconductor elements are mounted. In other words, the power semiconductor device sealed with the transfer molding resin has a structure in which the external terminals protrude from side surfaces near the resin-sealed portion. A bending process is performed on the external terminals for mounting of the power semiconductor device.

In a power semiconductor device, there is a necessity to secure a sufficient spatial insulation distance between external terminals. The conventional power semiconductor device sealed with the transfer molding resin has a structure in which the external terminals protrude from the side surfaces near the resin-sealed portion. If a sufficient insulation distance is to be secured between external terminals, then the power semiconductor device cannot be reduced in size. This causes a problem that a mounting area for the power semiconductor device is large.

Moreover, since the bending process is performed on the lead frames that are used as the external terminals, there is a limitation regarding the thickness thereof. For this reason, the amount of current to be applied to the external terminals cannot be increased. Thus, there is a problem that an increase in the current is limited in the power semiconductor device.

The present invention solves the above problems. The object of the present invention is to provide a power semiconductor device, formed by sealing with transfer molding resin, with improved productivity, reduced size and reduction of the mounting area, and in which external terminals connected to an external circuit do not limit an increase in the current, and on which external terminals having various different shapes can be mounted.

Solution to the Problems

In a power semiconductor device according to the present invention, transfer molding resin seals: a circuit substrate including a metallic heat dissipator and including a high thermal conductive insulation layer joined to one surface of the metallic heat dissipator and including a wiring pattern provided on a surface of the high thermal conductive insulation layer, which surface is opposite to a surface, of the high thermal conductive insulation layer, joined to the metallic heat dissipator; a power semiconductor element joined to an element mounting portion of the wiring pattern; and a side surface of a cylindrical external terminal communication section which is provided on the wiring pattern electrically connected to the power semiconductor element and to which an external terminal is insertable and connectable. The cylindrical external terminal communication section is provided so as to be substantially perpendicular to the surface on which the wiring pattern is formed. An outer surface of the metallic heat dissipator and a top portion of the cylindrical external terminal communication section are exposed from the transfer molding resin. The transfer molding resin is not present within the cylindrical external terminal communication section.

Effect of the Invention

The power semiconductor device according to the present invention has a structure in which the cylindrical external terminal communication section, to which the external terminal can be inserted and connected, is provided so as to be substantially perpendicular to the wiring pattern surface of the circuit substrate, and the top portion of the cylindrical external terminal communication section is exposed from the transfer molding resin. Accordingly, the external terminal can be inserted and connected to the cylindrical external terminal communication section, and the external terminal can be formed within a projection area of amounting surface for the power semiconductor device. Therefore, the power semiconductor device of the present invention can be reduced in size, and a space on an external circuit substrate or the like, which is necessary to mount the power semiconductor device, can be reduced.

In the case where multiple power semiconductor devices of the present invention are mounted on an external circuit substrate, even if adjacent power semiconductor devices are in close proximity to each other, an insulation distance therebetween can be sufficiently obtained. Accordingly, the power semiconductor devices in close proximity to each other can be mounted on an external circuit substrate. This allows mounting density to increase.

Further, since lead frames are not used in the power semiconductor device of the present invention, it is not necessary for the transfer molding to have dimensions necessary for sandwiching lead frames, whereby the number of power semiconductor devices formed from the same mold dimensions can be increased. Thus, productivity is improved.

Still further, since a metallic external terminal having an arbitrary cross-sectional size can be used for the power semiconductor device of the present invention, a cross-sectional size of a surface of the external terminal, which surface is perpendicular to a direction in which a current is applied to the external terminal, can be increased. Accordingly, a large current can be applied to the external terminal. Thus, a power semiconductor device, which is small in size and which enables large-current operation, can be realized.

BEST MODE FOR CARRYING OUT THE INVENTION

First Embodiment

Figure 1:
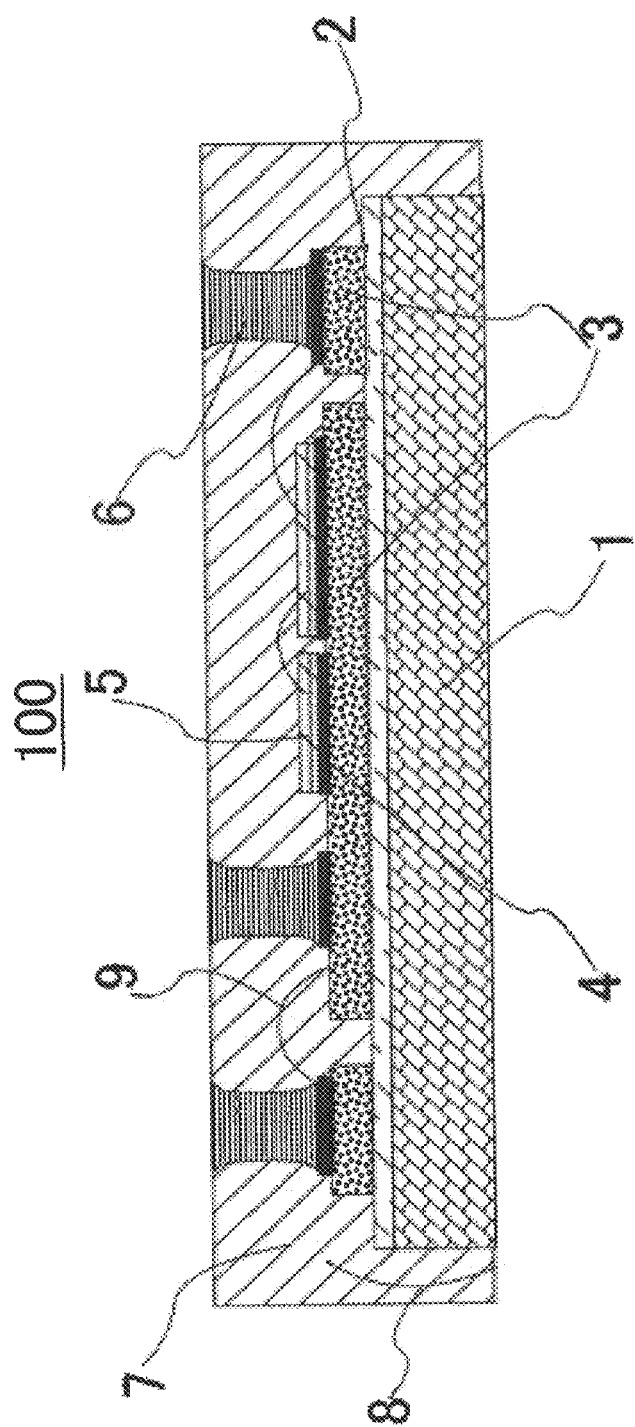
FIG. 1 is a schematic cross-sectional view showing a power semiconductor device according to the first embodiment of the present invention.

FIG. 1 is a schematic cross-sectional view showing a power semiconductor device according to the first embodiment of the present invention.

As shown in FIG. 1, in a power semiconductor device 100 of the present embodiment, a resin insulation layer 2, which is a high thermal conductive insulation layer, is provided on one surface of a metal plate 1 that acts as a metal heat dissipater for dissipating heat of the power semiconductor device 100. A surface of the resin insulation layer 2 has a metallic foil wiring pattern 3 provided thereon, which surface is opposite to a surface, of the resin insulation layer 2, joined to the metal plate 1.

That is, the metal plate 1, the resin insulation layer 2 and the wiring pattern 3 constitute a metallic circuit substrate 8 that is a circuit substrate. Power semiconductor elements 5 and cylindrical external terminal communication sections 6 are joined, by solder 4, to the wiring pattern 3 in a substantially perpendicular manner. Necessary electrical connections are formed, by wire bonding 9, between portions of the wiring pattern 3, between the power semiconductor elements 5, and between the wiring pattern 3 and the power semiconductor elements 5.

A surface of the metallic circuit substrate 8, on which the wiring pattern 3 is formed; peripheral side surfaces of the metallic circuit substrate 8; the power semiconductor elements 5; the wire bonding 9; and outer side surfaces of the cylindrical external terminal communication sections 6, are sealed with transfer molding resin 7. However, hole portions of the cylindrical external terminal communication sections 6 are not filled with the transfer molding resin 7.

In the present embodiment, a metal having excellent thermal conductivity, for example, aluminum, aluminum alloy, copper, copper alloy, steel, steel alloy, or the like may be used for the metal plate 1. Alternatively, a composite material such as a composite of copper/steel-nickel alloy/copper, a composite of aluminum/steel-nickel alloy/aluminum, or the like may be used for the metal plate 1. In particular, in the case of using the power semiconductor elements 5 each having a high current capacity, it is preferred to use copper having excellent thermal conductivity. The thickness, length and width of the metal plate 1 are properly determined based on the current carrying capacity of each power semiconductor element 5. That is, the thickness, length and width of the metal plate 1 are increased in accordance with an increase in the current carrying capacity of each power semiconductor element 5.

In the present embodiment, used as the resin insulation layer 2 may be, for example, a resin insulation sheet containing various ceramics and inorganic powder, or a resin insulation sheet containing glass fiber. The inorganic powder contained in the resin insulation layer 2 is, for example, alumina, beryllia, boron nitride, magnesia, silica, silicon nitride, or aluminum nitride. The thickness of the resin insulation layer 2 is, for example, 20 to 400 μm.

Further, in the present embodiment, for example, a copper foil is used for the wiring pattern 3, and aluminum wires are used for the wire bonding 9. The thickness of the copper foil used for the wiring pattern 3 and the diameter of the aluminum wires used for the wire bonding 9 are also properly determined based on the current carrying capacity of each power semiconductor element 5.

Still further, in the present embodiment, metal cylinders are used for the cylindrical external terminal communication sections 6, for example. The material used for the metal cylinders is preferably a metal plated with, for example, copper, copper alloy, aluminum, or aluminum alloy, which has excellent thermal conductivity and electrical conductivity and which can be joined to the wiring pattern 3 by the solder 4. The thickness of the cylindrical external terminal communication sections 6 is set so that the cylindrical external terminal communication sections 6 may not be crushed due to the molding pressure of the transfer molding.

The height of the cylindrical external terminal communication sections 6 is set to such a height as to allow external terminals, which are later inserted and connected, to be connected sufficiently.

Inner diameters of the cylindrical external terminal communication sections 6 are determined based on outer diameters of insertion portions of external terminals that are later inserted and connected to the cylindrical external terminal communication sections 6. The inner diameters of the cylindrical external terminal communication sections 6 are set so as to allow, at least, the external terminals to be attached to the cylindrical external terminal communication sections 6. The inner diameter of an edge portion, at the transfer molding resin surface side, of each cylindrical external terminal communication section 6 may be set to be equal to, or greater than, the inner diameter of the central portion of said each cylindrical external terminal communication section 6. In this manner, the external terminals can be readily inserted to the cylindrical external terminal communication sections 6.

In the present embodiment, for example, epoxy resin filled with silica powder filler is used as the transfer molding resin 7. In the transfer molding resin 7, the content percentage of the filled silica powder is determined to be an appropriate amount in consideration of a thermal expansion coefficient or the like of each component used in the power semiconductor device 100.

For example, when copper is used for the wiring pattern 3 and the metal plate 1, the amount of silica powder filling the epoxy resin is set such that the thermal expansion coefficient of the transfer molding resin 7 coincides with the thermal expansion coefficient of the copper, that is, 16 ppm/° C. In this manner, a power semiconductor device, in which a warp does not occur, can be obtained.

In order to improve heat dissipation of the transfer molding resin 7, it is preferred to use alumina powder as the filler, instead of silica powder.

Described next is an example of a manufacturing method of the power semiconductor device according to the present embodiment.

In manufacturing of the power semiconductor device 100 of the present embodiment, for example, an epoxy resin sheet containing B-stage alumina powder is placed on a 3 mm-thick aluminum plate, and a 0.3 mm thick copper foil is superimposed thereon. Then, the layer of: the aluminum plate; the epoxy resin sheet containing the alumina powder; and the copper foil, is heated and pressurized so as to join the aluminum plate and the copper foil via the epoxy resin sheet containing the alumina powder. Next, the wiring pattern 3 is formed by performing etching on the copper foil.

In this manner, the metallic circuit substrate 8 is formed, which includes: the aluminum metal plate 1; the resin insulation layer 2 formed of epoxy resin containing alumina powder; and the copper wiring pattern 3.

Next, by using the solder 4, the power semiconductor elements 5 are joined to element mounting portions provided at arbitrary positions on the wiring pattern 3, and the cylindrical external terminal communication sections 6 are joined to joining areas that are provided, for the cylindrical external terminal communication sections 6, at arbitrary positions on the wiring pattern 3.

Then, between portions of the wiring pattern 3, between the power semiconductor elements 5, and between the wiring pattern 3 and the power semiconductor elements 5, positions that require conduction therebetween are connected by the aluminum wire bonding 9.

Next, the metallic circuit substrate 8, on which the wire-bonded power semiconductor elements 5 and the cylindrical external terminal communication sections 6 are mounted, is set into a mold and then sealed by a transfer molding method with the transfer molding resin 7 that is of, for example, an epoxy resin type filled with silica powder.

The hole portions of the cylindrical external terminal communication sections 6 sealed with the transfer molding resin 7 are where the external terminals are connected.

The method for connecting the cylindrical external terminal communication sections 6 and the external terminals is soldering, press-in connection that is typically press fitting for metal-to-metal joint, thread connection, or the like. Preferred here is press-in connection, typically press fitting, which is low-cost and which has high reliability at joints and processes of which are simple.

In the sealing process using the transfer molding resin 7, there is a necessity to prevent the transfer molding resin 7 from entering an opposite surface side to a surface of the metal plate 1 of the metallic circuit substrate 8, the surface having the resin insulation layer 2 provided thereon, i.e., there is a necessity to prevent the transfer molding resin 7 from entering a heat dissipation surface side, and there is also a necessity to prevent the transfer molding resin 7 from entering the hole portions of the cylindrical external terminal communication sections 6.

If the resin reaches the heat dissipation surface of the metal plate 1, this results in a heat-insulated structure. Consequently, the heat generated from the power semiconductor elements 5 cannot be sufficiently dissipated therebelow. Also, if the transfer molding resin 7 enters the hole portions of the cylindrical external terminal communication sections 6, this causes a problem that the external terminals to be inserted to the cylindrical external terminal communication sections 6 cannot be inserted thereto.

Figure 2:
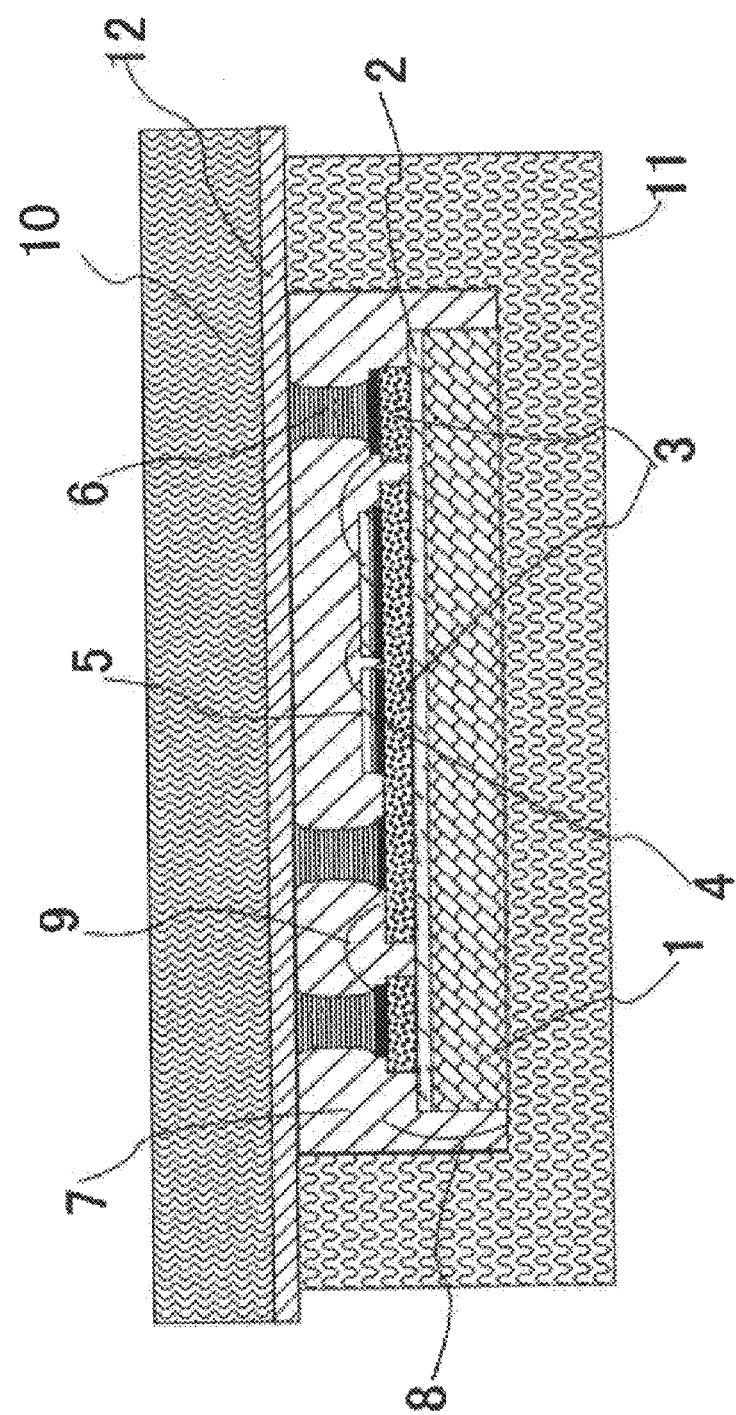
FIG. 2 illustrates means for preventing, in the power semiconductor device according to the first embodiment of the present invention, transfer molding resin from entering a heat dissipation surface side of a metal plate and from entering hole portions of cylindrical external terminal communication sections.

FIG. 2 illustrates means for preventing, in the power semiconductor device according to the first embodiment of the present invention, the transfer molding resin from entering the heat dissipation surface side of the metal plate and from entering the hole portions of the cylindrical external terminal communication sections.

As shown in FIG. 2, the means for preventing, in the power semiconductor device, the transfer molding resin from entering the heat dissipation surface side of the metal plate 1 and from entering the hole portions of the cylindrical external terminal communication sections 6 (hereinafter, referred to as transfer molding resin entrance prevention means) is formed such that: first, the power semiconductor device on which the wire bonding process has been completed is set into a lower mold 11 on which a spot facing process has been performed such that the measurement of the spot facing substantially coincides with the height of the power semiconductor device. Next, mold clamping is performed with: an upper mold 10 to which a resin sheet 12 is adhered and integrated by vacuuming or the like, the resin sheet 12 having no adhesion with the transfer molding resin 7 and having elasticity and having heat resistance that does not cause heat deterioration even at approximately 200° C.; and the lower mold 11 having the power semiconductor device set therein, on which power semiconductor device the wire bonding process has been completed. Then, a mold cavity formed with the upper mold 10 and the lower mold 11 is filled with the transfer molding resin 7. The resin sheet 12 used herein is, for example, a fluorine-type resin sheet such as a Teflon (registered trademark) sheet.

The depth of the spot facing on the lower mold 11 is set such that the cylindrical external terminal communication sections 6 of the power semiconductor device on which the wire bonding process has been completed, slightly dent into the resin sheet 12. The depth of the spot facing on the lower mold 11 substantially depends on the thickness of the resin sheet 12 to be used. For this reason, for example, if the fluorine-type resin sheet 12 that is 200 μm thick is used, the depth may be formed so as to have a tolerance of approximately 100 μm with respect to the height, from the heat dissipation surface of the metal plate 1, of the top surfaces of the cylindrical external terminal communication sections 6.

First transfer molding resin entrance prevention means using a mold having the above structure is excellent in mass production, and also, readily prevents the transfer molding resin 7 from reaching the heat dissipation surface of the metal plate 1 and from entering the hole portions of the cylindrical external terminal communication sections 6.

Further, in second transfer molding resin entrance prevention means (not shown), the height, from the heat dissipation surface of the metal plate 1, of the top surfaces of the cylindrical external terminal communication sections 6 is more precisely set, whereby the transfer molding resin 7 is prevented from entering a gap between the upper mold 10 and the top surfaces of the external terminal communication sections 6 and a gap between the lower mold 11 and the heat dissipation surface of the metal plate 1.

As for the second transfer molding resin entrance prevention means, there is a necessity to improve precision for setting the height of the power semiconductor device. Accordingly, it is necessary to manage, with a precision of a few μm, the height of the components used in the power semiconductor device and the height of the solder 4. Thus, strict management is required for the tolerance of the materials and for the processes. Still, the second transfer molding resin entrance prevention means can prevent the transfer molding resin 7 from reaching the heat dissipation surface of the metal plate 1 and from entering the hole portions of the cylindrical external terminal communication sections 6.

Still further, in third transfer molding resin entrance prevention means (not shown), elastic materials are partially provided on: a surface of the lower mold 11, the surface contacting the metal plate 1; and a surface of the upper mold 10, the surface contacting the cylindrical external terminal communication sections 6.

Since the elastic materials are partially provided in the third transfer molding resin entrance prevention means, complex operations, such as attaching or detaching these materials, are required, and every time the size of the metallic circuit substrate 8 or the positions of the cylindrical external terminal communication sections 6 are changed, the elastic materials to be provided need redesigning. Still, the third transfer molding resin entrance prevention means can prevent the transfer molding resin 7 from reaching the heat dissipation surface of the metal plate 1 and from entering the hole portions of the cylindrical external terminal communication sections 6.

Still further, in fourth transfer molding resin entrance prevention means (not shown), the hole portions of the cylindrical external terminal communication sections 6 are filled, in advance, with a material that has no adhesion with the transfer molding resin 7, and the filling material is removed after the transfer molding is performed.

As for the fourth transfer molding resin entrance prevention means, there is a necessity to completely remove the filling material. The deeper the depth of the cylindrical external terminal communication sections 6, the more complex the means required for removing the filling material becomes. Still, the fourth transfer molding resin entrance prevention means can prevent the transfer molding resin 7 from reaching the heat dissipation surface of the metal plate 1 and from entering the hole portions of the cylindrical external terminal communication sections 6. In particular, the transfer molding resin 7 is easily prevented from entering the hole portions of the cylindrical external terminal communication sections 6.

From among the first to fourth transfer molding resin entrance prevention means, particularly the first transfer molding resin entrance prevention means is able to readily prevent the transfer molding resin from entering the heat dissipation surface side of the metal plate 1 of the metallic circuit substrate 8 and from entering the hole portions of the cylindrical external terminal communication sections 6, even with a moderate precision of the height of the power semiconductor device.

Further, automatic replacement of the resin sheet 12 provided on the upper mold 10 is possible, and a single mold can accommodate any variation of the size of the metallic circuit substrate 8 and the positions of the cylindrical external terminal communication sections 6. This realizes excellent mass productivity and low cost.

Second Embodiment

Figure 3:
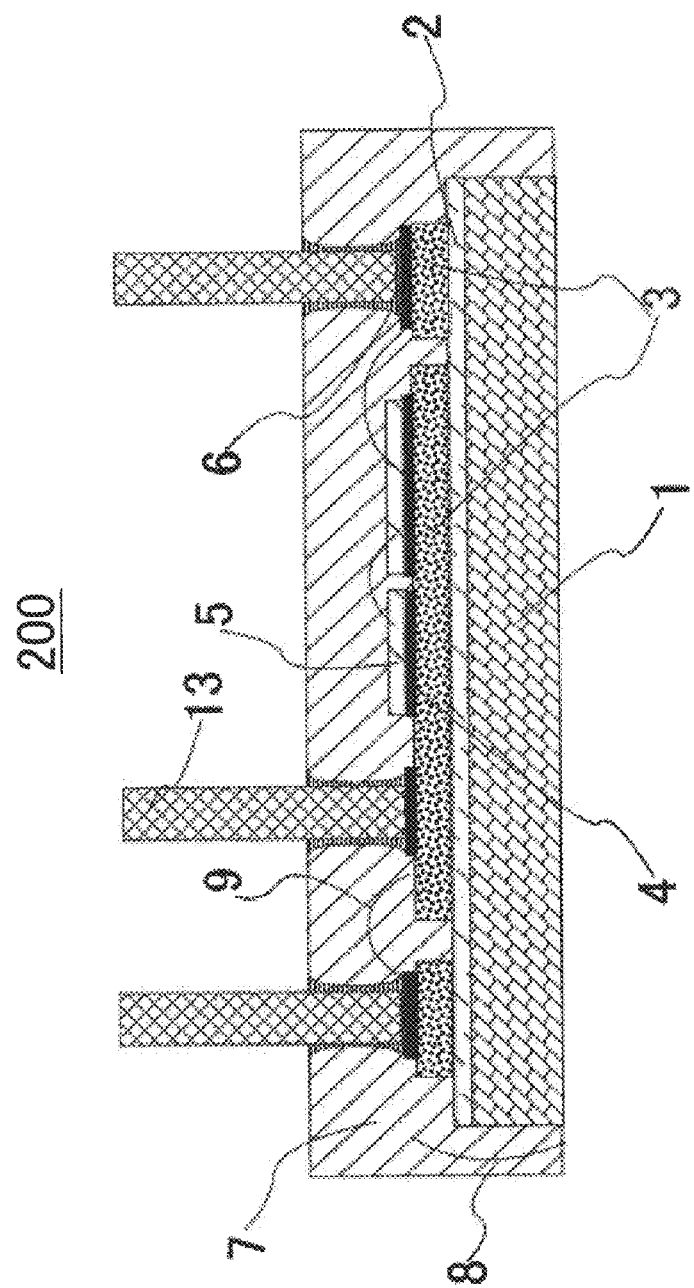
FIG. 3 is a schematic cross-sectional view showing a power semiconductor device according to the second embodiment of the present invention.

FIG. 3 is a schematic cross-sectional view showing a power semiconductor device according to the second embodiment of the present invention.

As shown in FIG. 3, a power semiconductor device 200 of the present embodiment is the same as the power semiconductor device according to the first embodiment except that rod-like external terminals 13 are inserted to the cylindrical external terminal communication sections 6 and that the external terminals 13 are electrically connected to a wiring circuit of the power semiconductor device.

In the present embodiment, a metal having excellent thermal conductivity and electrical conductivity is used for the external terminals 13. In particular, a copper material is preferred. Outer diameters of the external terminals 13 are properly determined based on the current carrying capacity of each power semiconductor element 5. The external terminals 13 each having a large outer diameter are used for the power semiconductor device 200 having a high current carrying capacity.

The power semiconductor device 200 of the present embodiment does not have a structure in which the external terminals 13 protrude from peripheral side surfaces of the transfer molding resin 7 of the power semiconductor device 200, but has a structure in which the external terminals 13 protrude from the transfer molding resin 7 in a substantially perpendicular direction with respect to a surface of the metallic circuit substrate 8, the surface having the wiring pattern 3 provided thereon. That is, the external terminals 13 are provided within a projection area of a mounting surface for the power semiconductor device. For this reason, the power semiconductor device of the present embodiment can be reduced in size, and a space on an external circuit substrate or the like, which is required to mount the power semiconductor device, can be reduced.

The power semiconductor device 200 of the present embodiment does not have a structure in which the external terminals protrude from peripheral side surfaces of the transfer molding resin. For this reason, in the case where multiple power semiconductor devices are mounted on an external circuit substrate, even if adjacent power semiconductor devices are in close proximity to each other, an insulation distance therebetween can be sufficiently obtained. Accordingly, the power semiconductor devices in close proximity to each other can be mounted on an external circuit substrate. This allows mounting density on an apparatus to increase.

Further, since metallic external terminals having arbitrary cross-sectional sizes can be used, cross-sectional sizes of surfaces of the external terminals, which surfaces are perpendicular to a direction in which currents are applied to the external terminals, can be increased in size. Accordingly, a large current can be applied to each external terminal. Thus, a power semiconductor device, which is small in size and which enables large-current operation, can be realized.

Third Embodiment

Figure 4:
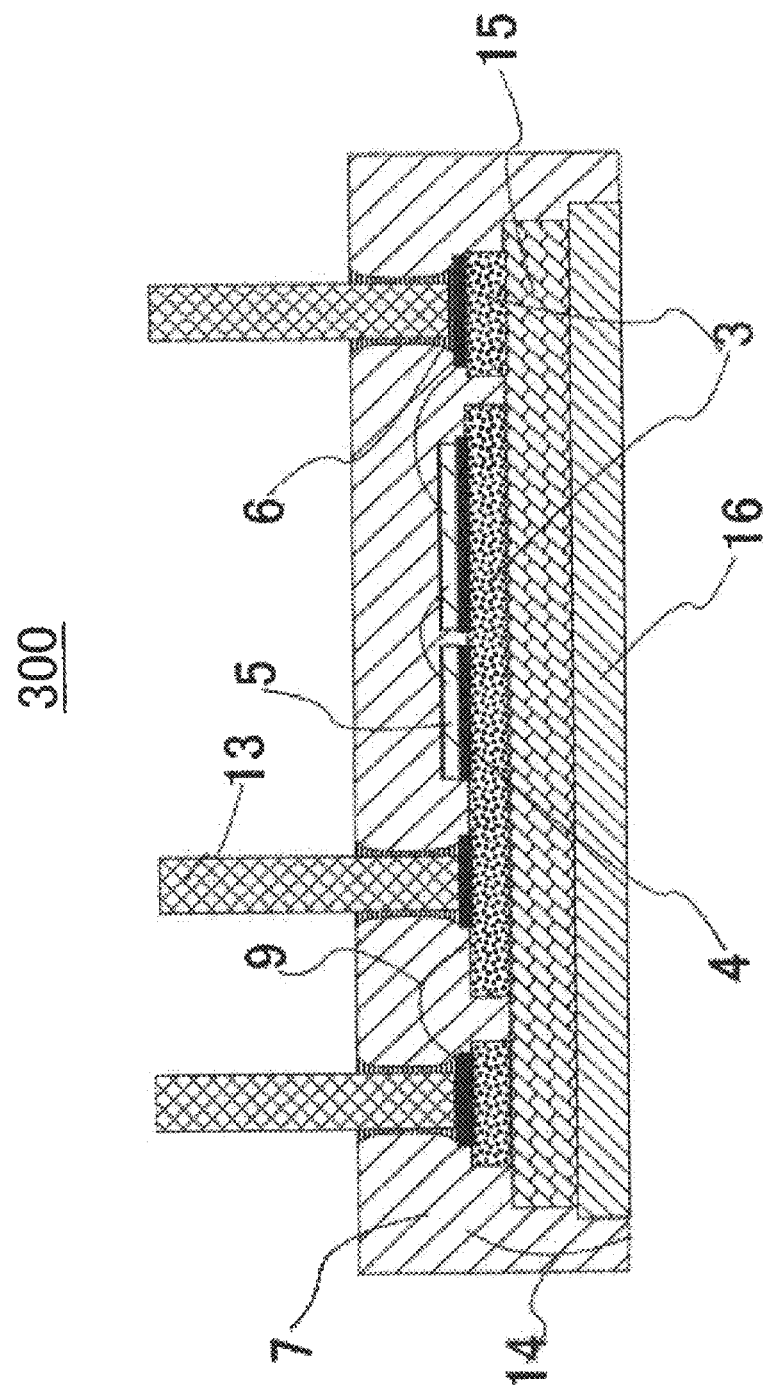
FIG. 4 is a schematic cross-sectional view showing a power semiconductor device according to the third embodiment of the present invention.

FIG. 4 is a schematic cross-sectional view showing a power semiconductor device according to the third embodiment of the present invention.

As shown in FIG. 4, a power semiconductor device 300 of the present embodiment is the same as the power semiconductor device of the second embodiment except that a ceramic circuit substrate 14 is used instead of the metallic circuit substrate 8.

As for the ceramic circuit substrate 14 of the present embodiment, a copper foil is joined to both surfaces of a ceramic plate 15 that is a high thermal conductive insulation layer. Similarly to the first embodiment, etching is performed on the copper foil provided on one of the surfaces of the ceramic plate 15, in order to form the wiring pattern 3, and the copper foil provided on the other surface, which is a copper foil 16, acts as a metal heat dissipater of the power semiconductor device 300.

In the present embodiment, alumina, aluminum nitride, silicon nitride, or the like is used as a material of the ceramic plate 15 of which the thickness is 0.1 mm to 1.0 mm.

In the power semiconductor device 300 of the present embodiment, a ceramic circuit substrate is used, and a thermal conductive property of the power semiconductor device, from the power semiconductor elements to the metal heat dissipater, is excellent. Accordingly, operation of the power semiconductor device with a further larger current can be realized, and heat stress generated during the operation of the power semiconductor device can be reduced. Also, since the power semiconductor device is excellent in insulation reliability, the power semiconductor device has improved long-term reliability.

Fourth Embodiment

Figure 5:
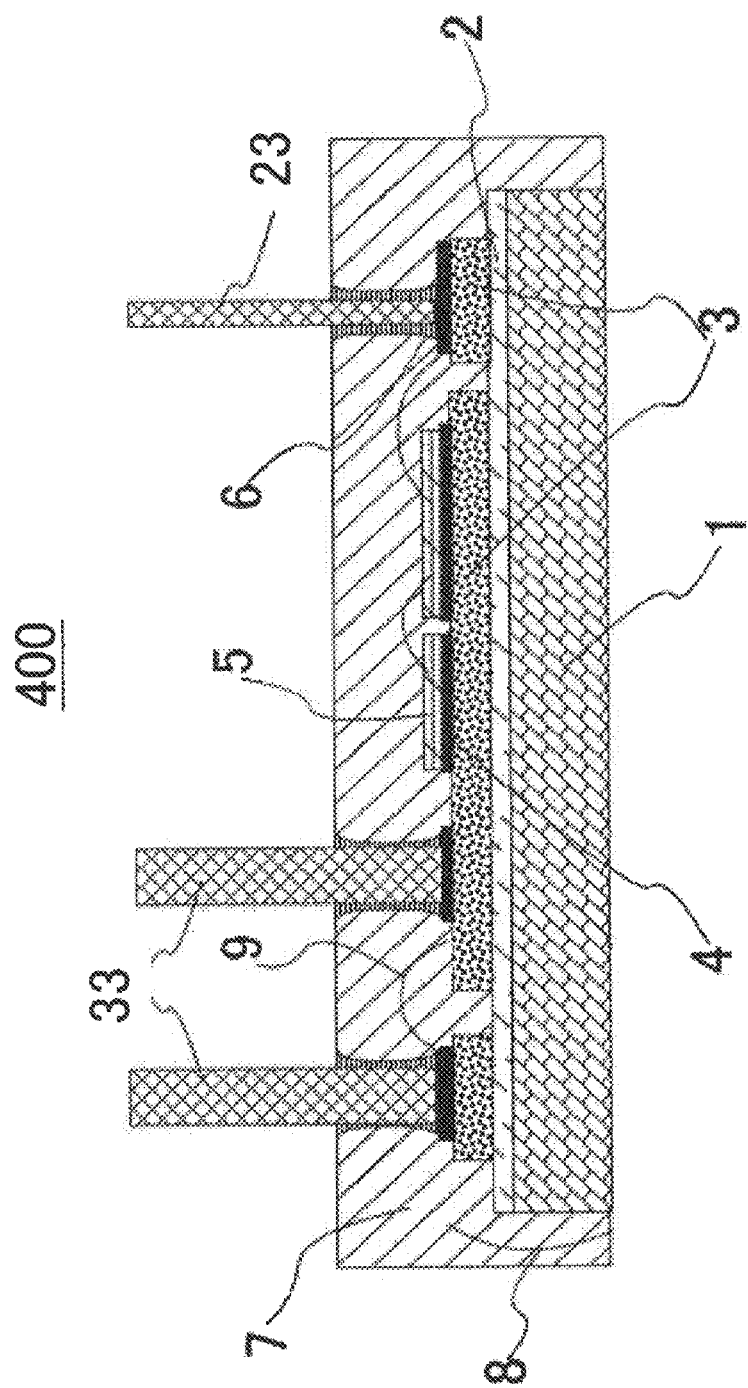
FIG. 5 is a schematic cross-sectional view showing a power semiconductor device according to the fourth embodiment of the present invention.

FIG. 5 is a schematic cross-sectional view showing a power semiconductor device according to the fourth embodiment of the present invention.

As shown in FIG. 5, in a power semiconductor device 400 of the present embodiment, the inner diameters of the cylindrical external terminal communication sections 6 vary from each other depending on current carrying capacities. To be specific, in the power semiconductor device, a cylindrical external terminal communication section 6 having a smaller diameter, to which a thinner external terminal 23 is connected, is used at a low-current portion, and a cylindrical external terminal communication section having a larger diameter, to which a thicker external terminal 33 is connected, is used at a large-current portion. Other than this, the power semiconductor device 400 is the same as the power semiconductor device of the second embodiment.

For instance, a specific example of a power semiconductor device, in which the inner diameters of the cylindrical external terminal communication sections 6 vary from each other, is the one in which a cylindrical external terminal communication section 6 having a smaller diameter and a thinner external terminal 23 are used for a signal terminal such as a gate, and a cylindrical external terminal communication section 6 having a larger diameter and a thicker external terminal 33 are used for an output terminal. This allows the power semiconductor device to be further reduced in size.

Fifth Embodiment

Figure 6:
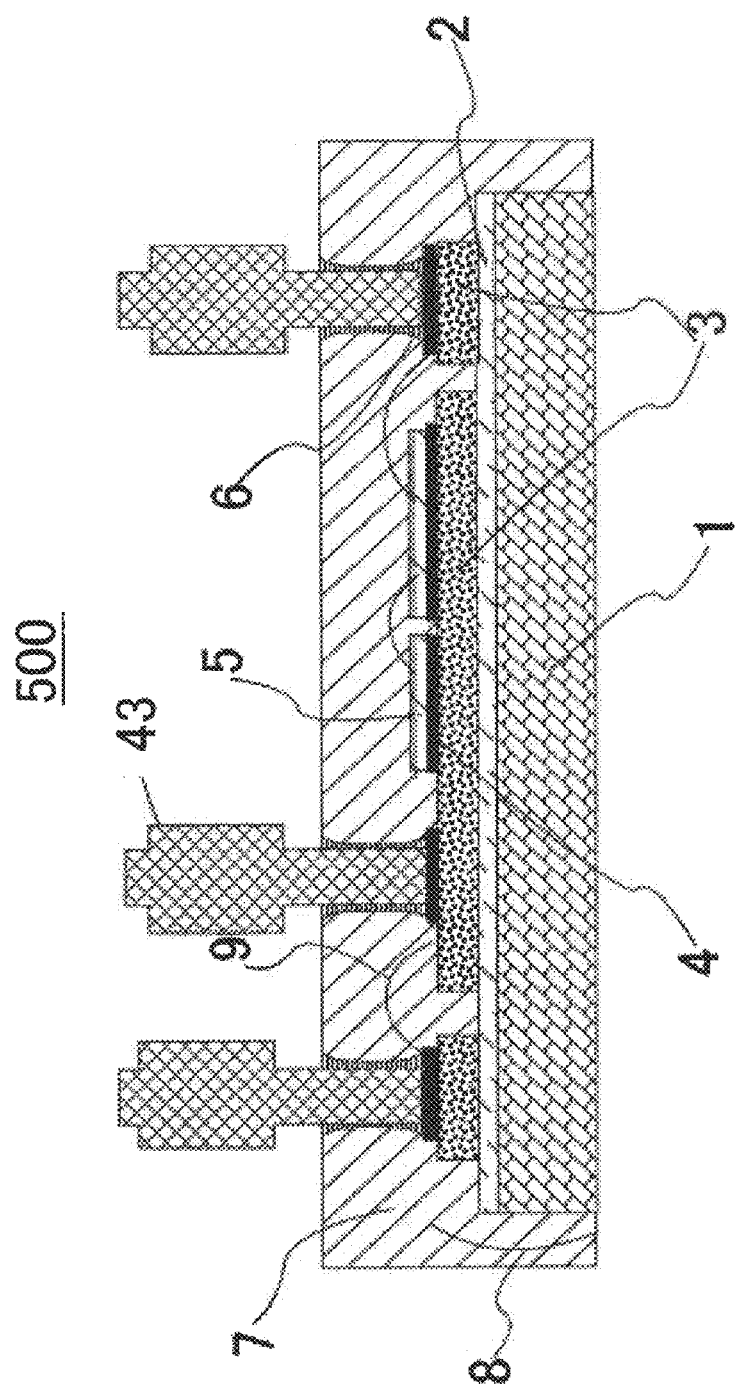
FIG. 6 is a schematic cross-sectional view showing a power semiconductor device according to the fifth embodiment of the present invention.

FIG. 6 is a schematic cross-sectional view showing a power semiconductor device according to the fifth embodiment of the present invention.

As shown in FIG. 6, a power semiconductor device 500 of the present embodiment is the same as the power semiconductor device of the second embodiment except that the external terminals protruding from the transfer molding resin 7 of the power semiconductor device are each partially thicker than an external terminal receiving portion of a corresponding cylindrical external terminal communication section 6, that is, external terminals 43 each having a thick protruding portion are used.

In the power semiconductor device 200 of the second embodiment, the diameter of each external terminal's portion protruding from the transfer molding resin 7 is smaller than a diameter that is formed by: an external terminal receiving portion; and a corresponding cylindrical external terminal communication section 6.

However, in the power semiconductor device 500 of the present embodiment, the diameter of each external terminal's portion protruding from the transfer molding resin 7 is equal to or greater than a diameter that is formed by: an external terminal receiving portion; and a corresponding cylindrical external terminal communication section. Accordingly, a power semiconductor device, which realizes operation with a further larger current, can be realized.

The same effect can be obtained when the external terminals of the present embodiment are used for the power semiconductor device of the third embodiment.

Sixth Embodiment

Figure 7:
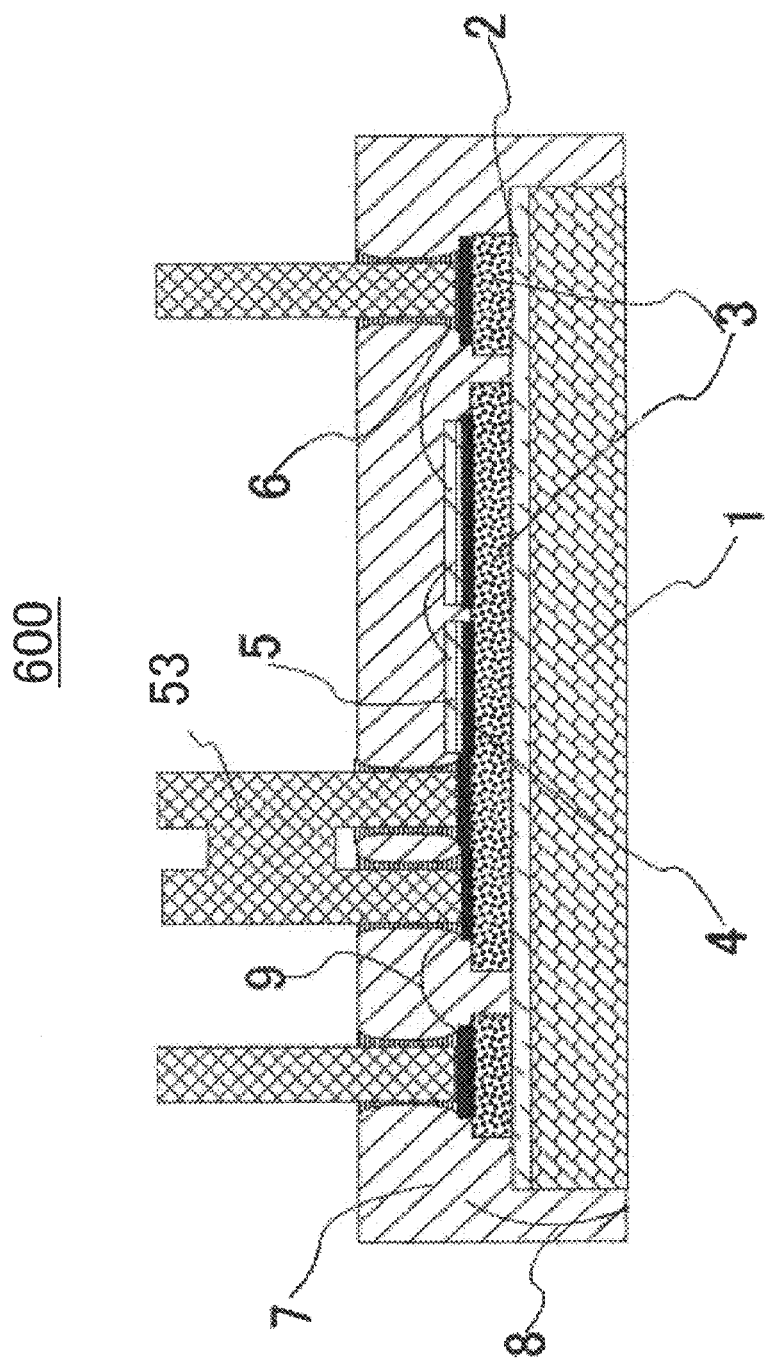
FIG. 7 is a schematic cross-sectional view showing a power semiconductor device according to the sixth embodiment of the present invention.

FIG. 7 is a schematic cross-sectional view showing a power semiconductor device according to the sixth embodiment of the present invention.

As shown in FIG. 7, in a power semiconductor device 600 of the present embodiment, at least one external terminal 53, which has multiple insertion portions to be inserted to multiple cylindrical external terminal communication sections 6, is used. Other than this, the power semiconductor device 600 is the same as the power semiconductor device of the second embodiment.

In the power semiconductor device 500 of the above fifth embodiment, in order to increase the amount of current to apply to the external terminals, the diameter of each external terminal's portion protruding from the transfer molding resin 7 is set to be equal to or greater than the diameter that is formed by: an external terminal receiving portion; and the corresponding cylindrical external terminal communication section 6.

However, in order to further increase the amount of current to apply, it is necessary to increase cross-sectional sizes of the insertion portions of the external terminals to be inserted to the cylindrical external terminal communication sections 6. This results in an increase in the inner diameters of the corresponding cylindrical external terminal communication sections 6. However, this causes an increase in size of solder joints of the cylindrical external terminal communication sections. Accordingly, there occurs a problem concerning reliability at the solder joints.

Whereas, in the power semiconductor device 600 of the present embodiment, the single external terminal 53 connects multiple cylindrical external terminal communication sections 6. In other words, there is no necessity for each of the multiple cylindrical external terminal communication sections 6 to have a specially increased inner diameter. Accordingly, soldering reliability of the cylindrical external terminal communication sections 6 is improved. Further, since the cylindrical external terminal communication sections 6 are connected to the external terminal 53 at multiple joints, connection reliability is also improved.

Moreover, the amount of current to be applied to the external terminals can be further increased. Thus, operation of the power semiconductor device with a further larger current can be realized.

Seventh Embodiment

Figure 8:
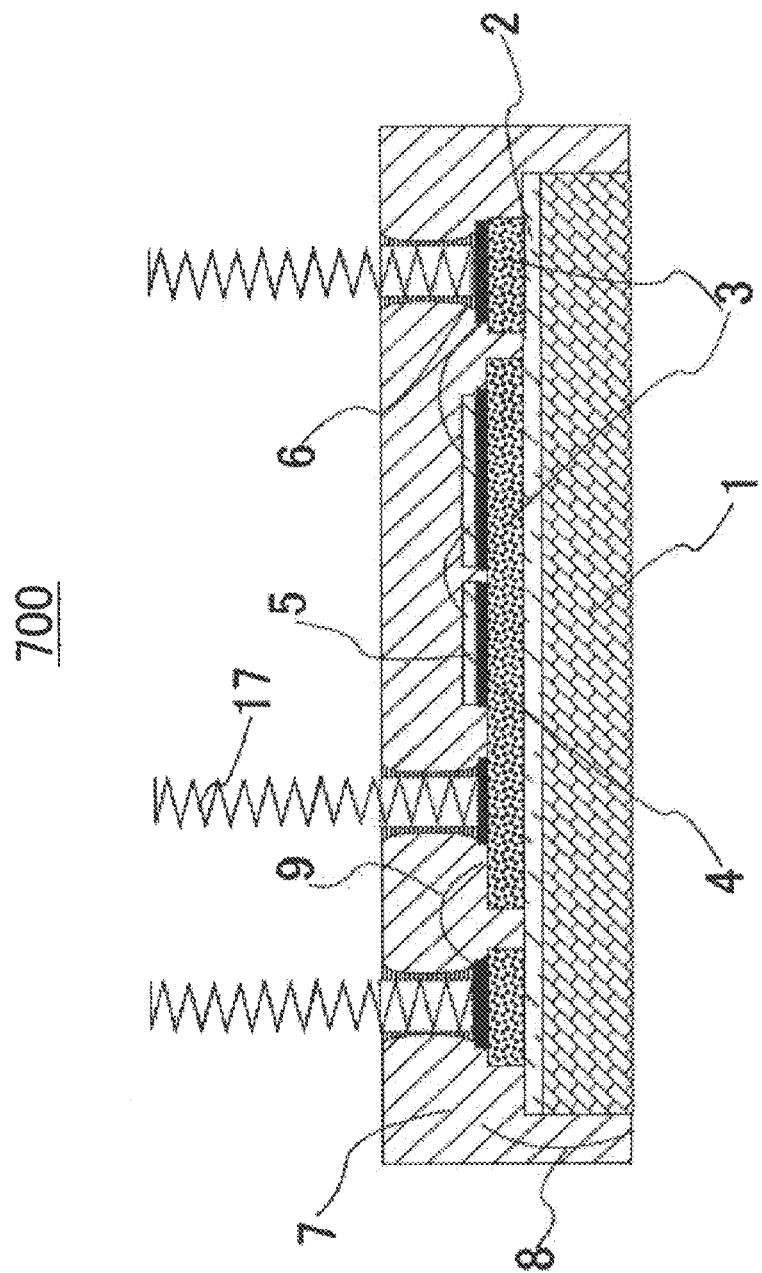
FIG. 8 is a schematic cross-sectional view showing a power semiconductor device according to the seventh embodiment of the present invention.

FIG. 8 is a schematic cross-sectional view showing a power semiconductor device according to the seventh embodiment of the present invention.

As shown in FIG. 8, a power semiconductor device 700 of the present embodiment is the same as the power semiconductor device of the second embodiment except that springs 17 are provided as external terminals to be inserted to the cylindrical external terminal communication sections 6.

The springs 17 are formed of, for example, coiled metal or wound metal, and connected to the inside of the cylindrical external terminal communication sections 6 by means of soldering or the like, for example.

In the power semiconductor device 700 of the present embodiment, the springs 17 are provided as the external terminals. Accordingly, an electrical connection with an external circuit substrate or the like can be formed, by causing the tip of each spring 17 to contact a pad portion of the external circuit substrate and then fixing the springs 17 with a load applied to the power semiconductor device.

That is, the external terminals of the power semiconductor device 700 of the present embodiment can be mounted on the external circuit substrate without joining by soldering or the like. This allows a defective power semiconductor device to be readily replaced. Thus, excellent repairability is obtained.

Although the power semiconductor device 700 of the present embodiment has a structure in which the external terminals are formed of metallic springs, the power semiconductor device 700 may have a structure in which a spring is provided at the tip of each external terminal.

Even if the structure of the present embodiment, in which the external terminals are springs, is used in the power semiconductor devices of the second to seventh embodiments, the same effects can be obtained.

Industrial Applicability

The power semiconductor device according to the present invention can be effectively utilized, in an apparatus requiring power, as a power semiconductor device which is small in size and which requires a large current.

The invention claimed is:

1. A power semiconductor device in which transfer molding resin seals:
    a circuit substrate including a metallic heat dissipater and including a thermal conductive insulation layer joined to one surface of the metallic heat dissipater and including a wiring pattern provided on a surface of the thermal conductive insulation layer, which surface is opposite to a surface, of the thermal conductive insulation layer, joined to the metallic heat dissipater;
    a power semiconductor element joined to an element mounting portion of the wiring pattern; and
    a side surface of a cylindrical external terminal communication section which is provided on the wiring pattern electrically connected to the power semiconductor element and to which an external terminal is inserted and connected,
    wherein:
    the cylindrical external terminal communication section is provided so as to be substantially perpendicular to the surface on which the wiring pattern is formed;
    an outer surface of the metallic heat dissipater and a top portion of the cylindrical external terminal communication section is exposed from the transfer molding resin;
    the transfer molding resin is not present within the cylindrical external terminal communication section; and
    a diameter of the external terminal communication section at a midpoint of the external terminal communication section is smaller than a diameter of the external terminal communication section at lowest and highest points of the external terminal communication section, the midpoint, lowest, and highest points of the external terminal communication section measured in a direction perpendicular to the surface on which the wiring pattern is formed.

2. The power semiconductor device according to claim 1, wherein the external terminal is inserted and connected to the cylindrical external terminal communication section.

3. The power semiconductor device according to claim 2, wherein the external terminal that is thicker than the cylindrical external terminal communication section is used.

4. The power semiconductor device according to claim 2, wherein the external terminal has a plurality of insertion portions, and the insertion portions of the external terminal are connected to a plurality of corresponding cylindrical external terminal communication sections.

5. The power semiconductor device according to claim 2, wherein a spring is provided as the external terminal.

6. The power semiconductor device according to claim 1, wherein the circuit substrate is a metallic circuit substrate including:
    a metal plate that is the metallic heat dissipater;
    a resin insulation layer that is the high thermal conductive insulation layer joined to one surface of the metal plate; and
    the wiring pattern provided on a surface of the resin insulation layer, which surface is opposite to a surface, of the resin insulation layer, joined to the metal plate.

7. The power semiconductor device according to claim 1, wherein the circuit substrate is a ceramic circuit substrate including:
    a ceramic plate that is the thermal conductive insulation layer;
    a metallic foil that is the metallic heat dissipater joined to one surface of the ceramic plate; and
    the wiring pattern provided on another surface of the ceramic plate.

8. The power semiconductor device according to claim 1, wherein the cylindrical external terminal communication section is a metal cylinder.

9. The power semiconductor device according to claim 1, comprising cylindrical external terminal communication sections having different inner diameters from each other.

10. The power semiconductor device according to claim 1, wherein inside wall of the cylindrical external terminal communication section is smoothly finished.

11. The power semiconductor device according to claim 1, wherein only a rod-shaped external terminal is inserted and connected to the external terminal communication section.

12. A power semiconductor device according to claim 1, wherein an external terminal suitable for press fitting is inserted and connected to the external terminal communication section.

* * * * *